United States Patent [19]

Kaplan et al.

[11] 4,036,644
[45] July 19, 1977

[54] PHOTORESIST PROCESS AND PHOTOSENSITIVE O-QUINONE DIAZIDE ARTICLE WITH ALIPHATIC CARBOXYLIC ACID AS ADHESION PROMOTOR

[75] Inventors: Leon H. Kaplan, Yorktown Heights; John Baldwin Lounsbury, Pleasant Valley, both of N.Y.; Steven Michael Zimmerman, Totton, England

[73] Assignee: International Business Machines Corporation, Armonk, N.Y.

[21] Appl. No.: 541,360

[22] Filed: Jan. 15, 1975

Related U.S. Application Data

[63] Continuation-in-part of Ser. No. 342,123, March 16, 1973, abandoned.

[51] Int. Cl.² .................. G03C 5/34; G03C 1/60
[52] U.S. Cl. .................... 96/36; 96/36.2; 96/49; 96/75; 96/91 D
[58] Field of Search .......... 96/91 N, 91 D, 91 R, 96/115 R, 49, 75, 36.2, 33.3 G

[56] References Cited

U.S. PATENT DOCUMENTS

| 3,046,121 | 7/1962 | Schmidt | 96/91 D |
|---|---|---|---|
| 3,118,767 | 1/1964 | Evans et al. | 96/115 P |
| 3,157,501 | 11/1964 | Burrows et al. | 96/36 |
| 3,201,239 | 8/1965 | Neugebauer et al. | 96/91 D |
| 3,321,309 | 5/1967 | Reichel | 96/91 N |
| 3,402,044 | 9/1968 | Steinhoff et al. | 96/91 D |
| 3,497,356 | 2/1970 | Martinson | 96/86 P |
| 3,514,288 | 5/1970 | Silver | 96/33 |
| 3,538,125 | 11/1970 | Kornfeld | 96/91 N |
| 3,615,532 | 10/1971 | Silver | 96/91 D |
| 3,627,597 | 12/1971 | Tiner | 156/13 |
| 3,759,711 | 9/1973 | Rauner et al. | 96/91 D |
| 3,890,153 | 6/1975 | Dijkstra | 96/91 D |

FOREIGN PATENT DOCUMENTS

| 986,949 | 3/1965 | United Kingdom |
|---|---|---|
| 1,065,665 | 4/1967 | United Kingdom |
| 1,185,388 | 3/1970 | United Kingdom |
| 1,205,566 | 9/1970 | United Kingdom |
| 1,212,718 | 11/1970 | United Kingdom |

OTHER PUBLICATIONS

Noller, C. R., "Textbook of Organic Chemistry," 2nd Ed., W. B. Saunders Co., 1951, pp. 111–112.

*Primary Examiner*—Charles L. Bowers, Jr.
*Attorney, Agent, or Firm*—David M. Bunnell

[57] ABSTRACT

Carboxylic acids are included in resists to increase their speed and adhesion.

10 Claims, No Drawings

PHOTORESIST PROCESS AND PHOTOSENSITIVE O-QUINONE DIAZIDE ARTICLE WITH ALIPHATIC CARBOXYLIC ACID AS ADHESION PROMOTOR

RELATED APPLICATION

This application is a continuation-in-part of copending application Ser. No. 342,123 filed Mar. 16, 1973, now abandoned.

BACKGROUND OF THE INVENTION

This invention relates generally to photolithography and more particularly to resist additives which improve the resist speed and the adhesion of the resist to the substrate surfaces encountered in the manufacture of integrated circuits.

In the manufacture of integrated circuits, resist processes are used to form patterns on the surface of the semiconductor substrate so that selected portions of the substrate can be treated. Such treatments include various etching, deposition and diffusion processes which are well known in the art of semiconductor component manufacture. The resist processes employ radiation sensitive polymer compositions which are coated onto the substrate surface and then exposed patternwise to light or other suitable electromagnetic radiation such as x-rays, gamma rays and electrons. The exposed resist layer is then developed to remove the soluble portions by treating the layer with a solvent. The portions of the substrate surface from which the resist has been removed can then be treated. One problem that occurs when the treatment is an etching process is undue enlargement of the pattern or undercutting which is the result of insufficient adhesion of the resist at the edges of the pattern. As semiconductor technology advances, the dimensions of the pattern geometry are continually decreasing so that the undercutting problem becomes more acute.

In the past, adhesion promoting coatings have been used with photoresists such as are described, for example, in Collins et al U.S. Pat. No. 3,549,368. Compounds have also been added to resist compositions to improve adhesion. We have now found a class of organic compounds which when added to resists act to improve both resist adhesion and resist speed.

BRIEF SUMMARY OF THE INVENTION

The resist additives of the invention are carboxylic acids which are organic compounds containing the —COOH functional group.

The invention provides a method of forming a resist mask pattern on a substrate in which the surface of the substrate is coated with a layer of radiation sensitive polymer resist composition which includes a carboxylic acid. The resist layer is exposed patternwise to radiation and the soluble portions of the layer are removed to uncover selected areas of the substrate surface.

The invention provides resist compositions having increased speed and adhesion by the inclusion in the resist compositions of a carboxylic acid.

DETAILED DESCRIPTION

The foregoing and other objects, features and advantages of the invention will be apparent from the following preferred embodiments of the invention wherein parts are parts by weight unless otherwise indicated.

Resist compositions are well known in the art. Negative resists are those which cross-link and become less soluble upon exposure to radiation. Examples of negative resists are sensitized polyvinyl cinnamate polymer compositions such as are described in U.S. Pat. No. 2,732,301 and sensitized partially cyclized poly-cis-isoprene polymer compositions such as are described in U.S. Pat. No. 2,852,379. Examples of positive resists which are degraded and become more soluble upon exposure to radiation are sulfone polymers, acrylic polymers such as polymethyl methacrylate and sensitized novolak resins such as are described, for example, in U.S. Pats. Nos. 3,666,473 and 3,201,239. The novolak resins are phenolformaldehyde resins which can be prepared by the acid catalyzed condensation of formaldehyde with an excess of a phenol. They are prepolymerized phenol-formaldehyde resins prepared by the reaction of formaldehyde with a phenol having the formula

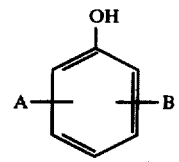

where (A) and (B) are selected from the group consisting of hydrogen and an alkyl group containing from one to six carbon atoms.

Suitable sensitizers are diazo ketones, for example, those having the formula

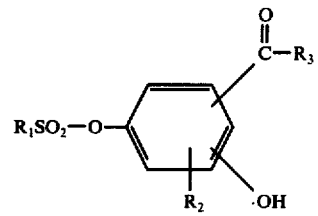

in which $R_1$ is a naphthoquinone-(1,2)-diazide radical, $R_2$ is selected from the group consisting of hydrogen and hydroxyl, and $R_3$ is selected from the group consisting of hydrogen, alkyl, acyl, alkoxy, acyloxy, amino, and heterocyclic groups.

The portions to be maintained between the diazo ketone sensitizer and the novolak resin are between about 1:1 and 1:6 by weight and preferably about 1:2 and 1:4 by weight of sensitizer to resin.

The resists are applied to substrates from solvent mixtures using conventional techniques such as spraying, flowing, roller, spinning and dip coating after which the solvent is removed by evaporation to leave a layer of resist on the surface of the substrate.

The speed and adhesion promotors of the invention are carboxylic acids which suitably are aliphatic acids containing from about 3 to 30 carbon atoms. The acids can contain more than one carboxy group per molecule and the presence of unsaturation in the carbon chain does not appear to matter. Preferred acids have from about 6 to 22 carbon atoms with optimum benefits being obtained at about 10 carbon atoms. Examples of such carboxylic acids include but are not limited to; propanoic, butanoic, pentanoic, hexanoic, decanoic, azelaic, dodecanedioic, and decosanoic.

Carboxylic acid deviatives such as alkali metal salts, esters, amides do not show adhesion enhancement.

The amounts of carboxylic acid to be used depend to some extend on the solubility of the acid in the resist solvents and the number of carboxylic acid groups per molecule. Excessive amounts should be avoided which would cause precipitation in the resist solution or crystallization in the resist layer. Generally amounts of from about 1 to 11% by weight of resist material, not including solvent are preferred. An optimum amount of decanoic acid would be from about 1 to about 8% by weight.

EXAMPLE 1

A thermally oxidized silicon substrate (10 ohm cm, p-type), having a 7000 angstrom thich oxide layer, was coated with a layer of positive photoresist about 8000 angstroms thick by spinning at 3500 rpm. The photoresist was a mixture of three parts of resist and one part of thinner containing about 0.1 moles/liter (17 grams/liter) of decanoic acid which corresponds to 0.3 moles of acid per 1000 grams of solids in the resist or about 5.6 percent. The resist comprised a m-cresol formaldehyde novolak resin and a diazo-ketone sensitizer which is the 2-diazo-1-oxo-naphthalene-5-sulfonic acid ester of 2,3,4-trihydroxybenzophenone in a proportion of about 75 percent by weight resin and 25 percent by weight sensitizer. The solid content of the resist solution was about 30 percent by weight. The resist and thinner solvents are a mixture of about 80 percent cellosolve acetate, 10 percent n-butyl acetate and 10 percent xylene. A second similar substrate was coated with resist containing no decanoic acid to serve as a control. Both substrates were baked for 15 minutes at 85° C on a hotplate. Both substrates were exposed in a conventional manner to actinic radiation for about 6 seconds through a combination of a test pattern mask which contained fine line geometries and a neutral density step plate which varied the exposure intensity in steps over the substrate. Both substrates were developed for four minutes in a conventional alkaline developer solution which had a pH of about 13 and was about a 5.0 percent by weight mixture of sodium meta-silicate and sodium orthophosphate and then rinsed with deionized water. The developer removed the exposed portions of the resist layer to uncover the areas of the substrate surface beneath the exposed portions of the resist layer and form a positive image. Both substrates were baked at 135° C for 30 minutes and then etched in a 7:1 buffered HF solution for 7 minutes. Both substrates were then immersed in a conventional stripper which is a mixture of tetrachloroethylene, dischlorobenzene, phenol and a Na alkyl napthalene sulfonte surfactant. Stripping was at 90° C for 15 minutes to remove the resist. Visual inspection of the resist patterns after development showed that the decanoic acid containing resist pattern had been opened completely in a step region having about half the exposure intensity of the step region which was completely opened in the unmodified resist. This indicated a doubling of the speed by the addition of the acid. An examination of the etched substrates by measuring at 1050× with a microfilar eyepiece showed an undercut per side of 15 microinches for the substrate protected with the decanoic modified resist as opposed to 50 microinches for the unmodified resist protected substrate.

EXAMPLE 2

The procedure of Example 1 was repeated using substrates which had been oxidized to a thickness of 24,000 angstroms with an etch time of 24 minutes. The results again showed a doubling of speed by using the decanoic modified resist. The substrate protected by carboxylic acid modified resist showed an undercut per side of 100 microinches as opposed to 335 microinches for the unmodified resist protected sample.

EXAMPLE 3

The procedure for Example 2 was repeated except that the samples were baked, after development for 30 minutes, at 85° C and an additional sample of unmodified resist protected substrate was baked for 30 minutes at 170° C. Measurement of the etched samples showed 90 microinches undercut per side on the 24,000 angstrom thick layer while the similarly baked unmodified resist allowed 195 microinches per side and the sample baked at 170° C allowed 185 microinches per side.

EXAMPLE 4

The process of Example 2 was repeated except that 0.1 moles per liter of docosanoic acid were added to form a modified resist corresponding to 0.3 moles of docosanic acid per 1000 grams of solid resist or about 11,0 percent by weight. The modified resist was 25 percent faster and gave an undercut of 135 microinches versus 335 microinches for the unmodified resist.

EXAMPLE 5

The process of Example 2 was repeated except that a concentration of 0.03 mole/liter of docosanoic acid was used corresponding to 0.10 moles of docosonoic acid per 1000 grams of solid resist or about 3.4 percent by weight. The results showed that the acid modified resist required 35 percent less exposure and caused 135 microinches per side undercut versus 335 microinches undercut per side with the unmodified resist.

EXAMPLE 6

The process of Example 2 was repeated except that the modifying acid was butanoic acid. The butanoic acid modified resist required about 20 percent less exposure than the modified resist and the undercut per side was observed to be 160 microinches versus the 335 microinches observed for the control.

EXAMPLE 7

The process of Example 1 was repeated with 0.3 mole/liter of decanoic acid corresponding to 1.0 mole of decanoic acid per 1000 grams of solids or 17.0 percent by weight. Although a satisfactory adhesion improvement was obtained, a large amount of crystallization was observed due probably to the separation of excess acid from the resist. It is expected that the crystallization would impact yields in a device wafer.

EXAMPLE 8

The process of Example 1 was repeated with decyl alcohol, methyl stearate, and sodium stearate being substituted for the decanoic acid. In each case no improvement in speed or adhesion was observed between the modified resist and the control samples.

EXAMPLE 9

The process of Example 1 was repeated using azelaic acid which is a difunctional acid. The results observed were similar to Example 1 in that an pproximately 2:1 improvement in speed and a substantial improvement in adhesion over the unmodified resist was observed.

EXAMPLE 10

The process of Example 1 was repeated using oleic acid which is an unsaturated acid. The results were similar to the improvements observed in Example 1.

EXAMPLE 11

The process of Example 1 was repeated except that the silicon substrates were covered with a layer of phosphosilicate glass. The resist layer was coated onto the glass layer. The sample protected with decanoic acid modified resist gave an undercut which was only 0.62 times that allowed by the unmodified resist.

EXAMPLE 12

The process of Example 1 was repeated except that the silicon substrates were covered by a layer of sputtered quartz. The resist layer was coated onto the quartz layer. Results showed that the decanoic acid modified resist allowed an undercut which was only 0.59 times that allowed by the unmodified resist.

EXAMPLE 13

The process of Example 1 was repeated except that the silicon substrates were coated with a 1 micron thick metal conductor layer of copper-doped aluminum. The resist layer was coated onto the metal conductor layer. The etch was in a 80:16:4 by volume solution of 85% $H_3PO_4:H_2O$: 70% $HNO_3$ at 32° C for sufficient time to completely remove the exposed portions of the metal layer (approximately 20 minutes). Results showed that the decanoic acid modified resist allowed an undercut of only 0.59 times that allowed by the unmodified resist.

EXAMPLE 14

To further illustrate the variation of results with concentration, a series of resists were prepared using concentrations of docosanoic acid ranging from 0.03 moles/liters to 0.15 moles per liter. The procedure of Example 2 was followed using an exposure for 7 seconds, a postbake of 30 minutes at 170° C and a 24 minute etch. Adhesion was determined as in Example 1 by measurement of the top and bottom dimension of the nominal 500 microinch line set. The undercut per side was then divided by the oxide thickness to obtain an oxide edge cotangent. Thicknesses were determined via a Talystep. The results are listed in Table I below:

Table I

| Variation with Concentration Of Docosanoic Acid | | |
|---|---|---|
| Concentration Mole/Liter | Relative Exposure Time | Oxide Edge Cotangent |
| 0.15 | 1.00 | 1.50 |
| 0.12 | 0.80 | 1.25 |
| 0.09 | 0.80 | 1.23 |
| 0.06 | 0.80 | 1.31 |
| 0.03 | 0.80 | 1.40 |
| 0.00 | 1.25 | 3.50 |

With docosanoic acid and optimum concentration for adhesion appears to be about 0.1 mole/liter with no observed change in speed with concentrations at or below 0.12 mole/liter.

EXAMPLE 15

The procedure of Example 14 was repeated using four acids at the concentrations given in Table II below:

Table II

| Acid | Concentration Mole/Liter | Relative Exposure Time | Oxide Edge Cotangent |
|---|---|---|---|
| Hexanoic | 0.15 | 1.00 | 1.52 |
| Deconoic | 0.15 | 0.64 | 1.02 |
| Dodecandioic | 0.074 | 0.80 | 1.17 |
| Docosanoic | 0.15 | 1.00 | 1.40 |
| None | — | 1.25 | 3.50 |

EXAMPLE 16

In order to further illustrate the effect of postbake temperature on adhesion, the process of Example 14 was repeated using a concentration of 0.15 mole/liter of docosanoic acid with the postbaking temperatures shown in Table III below for 30 minutes:

Table III

| Postbake Temperature | Oxide Edge Cotangent |
|---|---|
| 170° C (control) | 3.50 |
| 170° C | 1.40 |
| 135° C | 1.23 |
| 120° C | 1.20 |
| 105° C | 0.79 |

From these results, it appears that with the acid modified resist the adhesion decreased with increasing temperature.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process for forming a resist mask pattern on a silicon substrate having a surface coating selected from the group consisting of silicon oxide, phosphosilicate glass, sputtered quartz and metal comprising:

coating the surface coating with a layer of radiation sensitive polymer resist composition consisting essentially of a novolak resin and a diazo ketone sensitizer having the formula

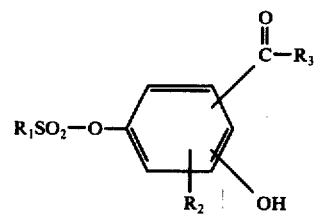

in which $R_1$ is a naphthoquinone (1,2) diazide radical, $R_2$ is selected from the group consisting of hydrogen and hydroxyl, and $R_3$ is selected from the group consisting of hydrogen, alkyl, acyl, alkoxy, acyloxy, amino, and heterocyclic groups, in proportions of between about 1:1 and 1:6 weight of sensitizer to resin and from about 1 to 11% by weight of solids in the resist of an aliphatic carboxylic acid containing from about 3 to 30 carbon atoms, exposing said layer patternwise to actinic radiation for said sensitizer, and removing the exposed portions of said layer with a solvent developer for the actinic radiation exposed polymer resist composition to uncover the areas of the substrate surface beneath the exposed portions of the resist layer.

2. The process of claim 1 including the step of etching the uncovered areas of the substrate.

3. The process of claim 1 wherein the acid additive is decanoic acid.

4. The process of claim 1 wherein the acid is an aliphatic acid containing from about 6 to 22 carbon atoms.

5. The process of claim 1 wherein the acid is docosanoic acid.

6. The process of claim 1 wherein the acid is azelaic acid.

7. The process of claim 1 wherein the acid is dodecanedioic acid.

8. The process of claim 1 wherein the acid is hexanoic acid.

9. The process of claim 1 wherein the acid is butanoic acid.

10. An article comprising a silicon substrate having a surface coating selected from the group consisting of silicon oxide, phosphosilicate glass, sputtered quartz and metal coated with a layer of resist consisting essentially of a novolak polymer, a light sensitive diazo ketone compound having the formula

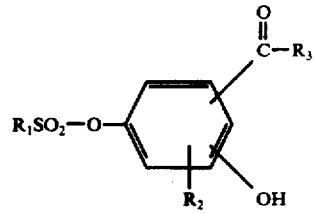

in which $R_1$ is a naphthoquinone-1,2)-diazide radical, $R_2$ is selected from the group consisting of hydrogen and hydroxyl, and $R_3$ is selected from the group consisting of hydrogen, alkyl, acyl, alkoxy, acyloxy, amino, and heterocyclic groups, in proportions of between about 1:1 and 1:6 by weight of diazo ketone of novolak polymer, and from about 1 to 11% by weight based on resist solids of an aliphatic carboxylic acid containing from about 3 to 30 carbon atoms.

* * * * *